United States Patent

(12) United States Patent
Miyamoto

(10) Patent No.: US 9,082,916 B2
(45) Date of Patent: Jul. 14, 2015

(54) SOLAR BATTERY CELL, SOLAR BATTERY MODULE, AND JOINING METHOD OF LEAD WIRE OF SOLAR BATTERY CELL

(75) Inventor: Shinsuke Miyamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 98 days.

(21) Appl. No.: 13/992,769

(22) PCT Filed: Feb. 16, 2011

(86) PCT No.: PCT/JP2011/053248
§ 371 (c)(1),
(2), (4) Date: Jun. 10, 2013

(87) PCT Pub. No.: WO2012/111108
PCT Pub. Date: Aug. 23, 2012

(65) Prior Publication Data
US 2013/0255748 A1  Oct. 3, 2013

(51) Int. Cl.
*H01L 31/00* (2006.01)
*H01L 31/05* (2014.01)
*H01L 31/0224* (2006.01)
*H02S 30/10* (2014.01)

(52) U.S. Cl.
CPC .... *H01L 31/0508* (2013.01); *H01L 31/022425* (2013.01); *H01L 31/0504* (2013.01); *H02S 30/10* (2014.12); *Y02E 10/50* (2013.01)

(58) Field of Classification Search
CPC .......................... H01L 31/0504; H01L 31/0508
See application file for complete search history.

(56) References Cited

U.S. PATENT DOCUMENTS

2009/0032081 A1* 2/2009 Saita et al. ............... 136/244
2013/0255748 A1* 10/2013 Miyamoto ................ 136/244

FOREIGN PATENT DOCUMENTS

| CN | 101373796 A | 2/2009 |
| JP | 11-103078 A | 4/1999 |
| JP | 11-312820 A | 11/1999 |
| JP | 2002-280591 A | 9/2002 |
| JP | 2009-54981 A | 3/2009 |

(Continued)

OTHER PUBLICATIONS

International Search Report (PCT/ISA/210) issued on Mar. 22, 2011, by the Japanese Patent Office as the International Searching Authority for International Application No. PCT/JP2011/053248.
Written Opinion (PCT/ISA/237) issued on Mar. 22, 2011, by the Japanese Patent Office as the International Searching Authority for International Application No. PCT/JP2011/053248.

(Continued)

*Primary Examiner* — Eli Mekhlin
(74) *Attorney, Agent, or Firm* — Buchanan Ingersoll & Rooney PC

(57) ABSTRACT

A solar battery cell includes: a light-receiving-surface bus electrode; a light receiving surface of a semiconductor substrate; and a long lead wire for extracting electricity. The light-receiving-surface bus electrode extends in a predetermined direction on the light receiving surface of the semiconductor substrate and the long lead wire is overlapped on and joined to the light-receiving-surface bus electrode. The light-receiving-surface bus electrode and the lead wire are respectively provided with mutually engaging, without a gap, convex portions and concave portions on surfaces thereof facing each other to regulate misalignment in a width direction between the light-receiving-surface bus electrode and the lead wire.

21 Claims, 11 Drawing Sheets

(56) References Cited

FOREIGN PATENT DOCUMENTS

| JP | 2009-81217 A | 4/2009 |
| JP | 2009-295940 A | 12/2009 |

OTHER PUBLICATIONS

Notification of First Office Action dated Mar. 18, 2015 issued in the corresponding Chinese Patent Application No. 2011800654378 (14 pages).

* cited by examiner

Prior Art

Prior Art

SOLAR BATTERY CELL, SOLAR BATTERY MODULE, AND JOINING METHOD OF LEAD WIRE OF SOLAR BATTERY CELL

FIELD

The present invention relates to: a solar battery cell having a light-receiving-surface bus electrode on a light receiving surface formed on one surface of a semiconductor substrate such as a silicon substrate and a rear-surface bus electrode on a rear surface of the semiconductor substrate, in which a lead wire for extracting electricity is respectively connected to the light-receiving-surface bus electrode and the rear-surface bus electrode; a solar battery module in which a plurality of solar battery cells are connected by a lead wire; and a joining method of a lead wire of a solar battery cell.

BACKGROUND

As a solar battery module, a solar battery module having such a configuration that a plurality of solar battery cells having a light-receiving-surface bus electrode on a light receiving surface as a collective electrode and a rear-surface bus electrode on a rear surface are arranged in parallel in a matrix; a light-receiving-surface bus electrode of a certain solar battery cell is connected to a rear-surface bus electrode of another solar battery cell adjacent thereto by a belt-shaped lead wire (an interconnector); and this process is sequentially repeated to electrically connect a plurality of solar battery cells has been known.

The belt-shaped lead wire is generally referred to as "tab wire", and a lead wire in which the whole surface of highly conductive metal is solder-coated, such as copper foil or metal foil is used. The lead wire is spanned and arranged from a light-receiving-surface electrode of one solar battery cell to a rear-surface electrode of an adjacent solar battery cell, and the light-receiving-surface electrode and the rear-surface electrode of the both cells are electrically connected.

The connection between the lead wire and the respective electrodes is performed by arranging the lead wire on the electrodes formed in a strip form on the surface and the rear surface of the solar battery cell, heating the lead wire to melt the solder, and, in this state, by pressing the lead wire to the solar battery cell partially or over the whole length to perform solder joining thereto.

In such lead wire joining of the solar battery cell, heating is performed by main heating by infrared rays irradiated from an infrared lamp heater, for example, arranged above the solar battery cell, and auxiliary heating from a hot plate on which the solar battery cell is placed, and pressing is performed by pressurizing the lead wire to the silicon substrate at a plurality of points away from each other in a length direction of the lead wire.

The lead wire is joined to the surface by melting the coated solder, or may be also joined thereto by pressing in a state with a resin applied to the surface of the solar battery cell or the lead wire being melted. The connection structure described above by solder or resin of the belt-shaped lead wire is disclosed in Patent Literature 1, for example.

CITATION LIST

Patent Literature

Patent Literature 1: Japanese Patent Application Laid-open No. 11-103078

SUMMARY

Technical Problem

An electrode formed on a surface of a solar battery cell for connection of a lead wire (referred to as "bus electrode") is generally formed on a surface of a solar battery cell in a long and thin convex shape, and the lead wire is overlapped and joined thereon. The bus electrode is substantially in a square shape or substantially in a square shape close to a semi-circular shape in cross section. Therefore, the lead wire may fall off from the bus electrode.

Particularly, when the lead wire falls off (drops off) from the bus electrode formed on a light receiving surface of the solar battery cell (the light-receiving-surface bus electrode), the lead wire partially blocks the light receiving surface around the bus electrode. Accordingly, incident light to the solar battery cell is blocked, and the lead wire and the bus electrode are not connected stably, thereby increasing the resistance loss.

The present invention has been achieved to solve the above problems, and an object of the present invention is to provide a solar battery cell in which a lead wire is not deviated from on a bus electrode, the lead wire and the bus electrode can be connected in a good connection state, and the lead wire does not block a light receiving surface, and to provide a solar battery module and a joining method of a lead wire of a solar battery cell.

Solution to Problem

To solve above problems and achieve the object, according to an aspect of the present invention, a solar battery cell having a light-receiving-surface bus electrode extending in a predetermined direction on a light receiving surface of a semiconductor substrate, in which a long lead wire for extracting electricity is overlapped on and joined to the light-receiving-surface bus electrode. And the light-receiving-surface bus electrode and the lead wire are respectively provided with mutually engaging convex portions and concave portions on surfaces thereof facing each other to regulate misalignment in a width direction between the light-receiving-surface bus electrode and the lead wire.

According to another aspect of the present invention, the solar battery cell having a light-receiving-surface bus electrode extending in a predetermined direction on a light receiving surface of a semiconductor substrate and a rear-surface bus electrode on a rear surface of the semiconductor substrate, in which a long lead wire for extracting electricity is respectively overlapped on and joined to the light-receiving-surface bus electrode and the rear-surface bus electrode. And the light-receiving-surface bus electrode and the lead wire are respectively provided with mutually engaging convex portions and concave portions on surfaces thereof facing each other of to regulate misalignment in a width direction between the light-receiving-surface bus electrode and the lead wire.

According to still another aspect of the present invention, a solar battery module includes: a plurality of solar battery cells having a light-receiving-surface bus electrode extending in a predetermined direction on a light receiving surface of a semiconductor substrate and a rear-surface bus electrode on a rear surface of the semiconductor substrate; and a long lead wire that electrically connects the light-receiving-surface bus electrode of a first solar battery cell and the rear-surface bus electrode of a second solar battery cell adjacent thereto. And the light-receiving-surface bus electrode and the lead wire are formed to extend in a length direction on surfaces facing each other and respectively provided with mutually engaging convex portions and concave portions to regulate misalignment in a width direction between the light-receiving-surface bus electrode and the lead wire.

According to still another aspect of the present invention, a joining method of a lead wire of a solar battery cell in which a long lead wire for extracting electricity is respectively overlapped on and joined to a light-receiving-surface bus electrode and a rear-surface bus electrode of a solar battery cell having the light-receiving-surface bus electrode extending in a predetermined direction on a light receiving surface of a semiconductor substrate and the rear-surface bus electrode on a rear surface of the semiconductor substrate, the joining method includes: forming convex portions and concave portions extending in a length direction on surfaces facing each other of the light-receiving-surface bus electrode and the lead wire; and engaging the convex portions and the concave portions with each other, overlapping the lead wire on the light-receiving-surface bus electrode and joining the light-receiving-surface bus electrode and the lead wire to each other, while regulating misalignment in a width direction between the light-receiving-surface bus electrode and the lead wire.

Advantageous Effects of Invention

According to the present invention, because a lead wire is not deviated from on a bus electrode of a solar battery cell, a light receiving surface is not blocked by the lead wire, and the bus electrode and the lead wire of the solar battery cell can always maintain a stable connection state.

DESCRIPTION OF EMBODIMENTS

Exemplary embodiments of a solar battery cell, a solar battery module, and a joining method of a lead wire of a solar battery cell according to the present invention will be explained below in detail with reference to the accompanying drawings. The present invention is not limited to the embodiments.

Embodiment

Figure 1:
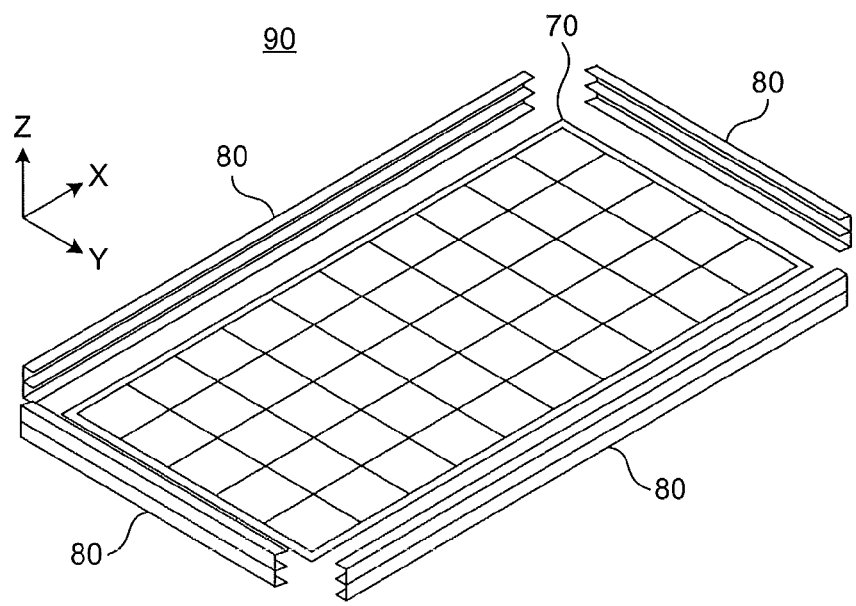
FIG. 1 is a perspective view of a solar battery module, depicting a state where a frame member is attached to a solar battery panel.
Figure 2:
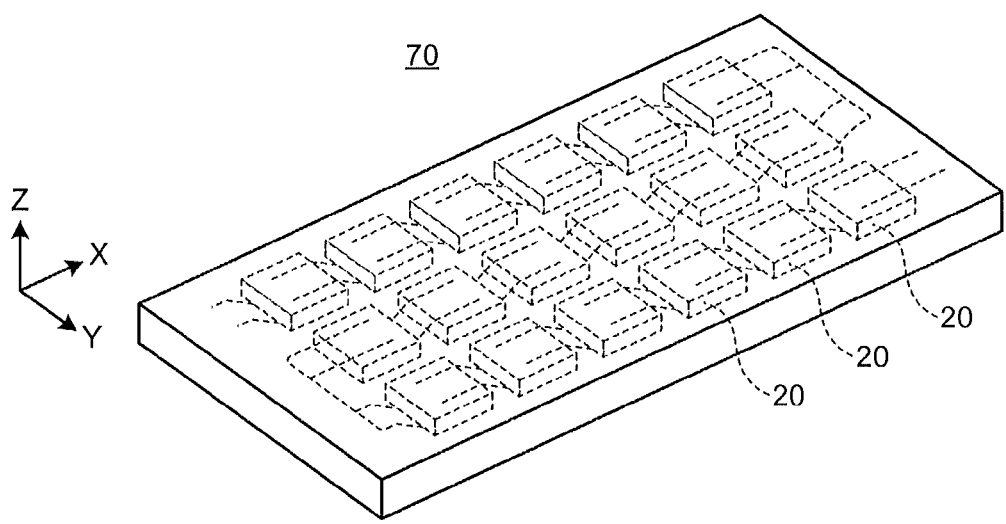
FIG. 2 is a perspective view of a state where a solar battery array constituted by sequentially connecting a plurality of solar battery cells by a lead wire is sealed in a solar battery panel.
Figure 3:
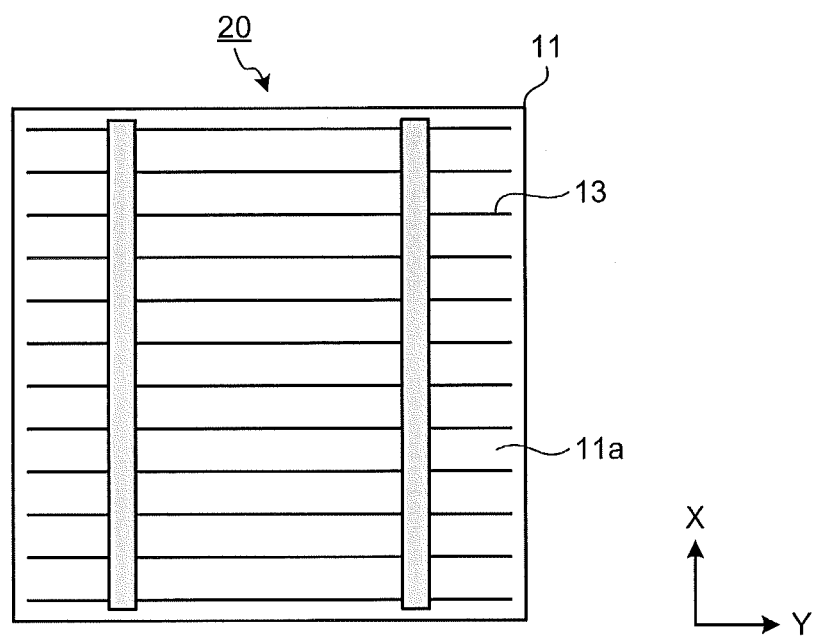
FIG. 3 is a top view of a solar battery cell.
Figure 4:
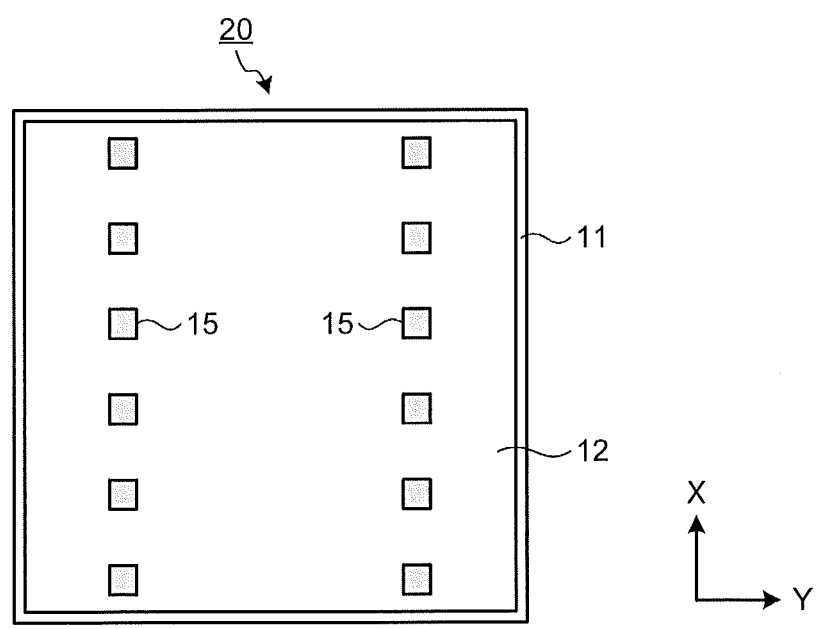
FIG. 4 is a rear view of a solar battery cell.
Figure 5:
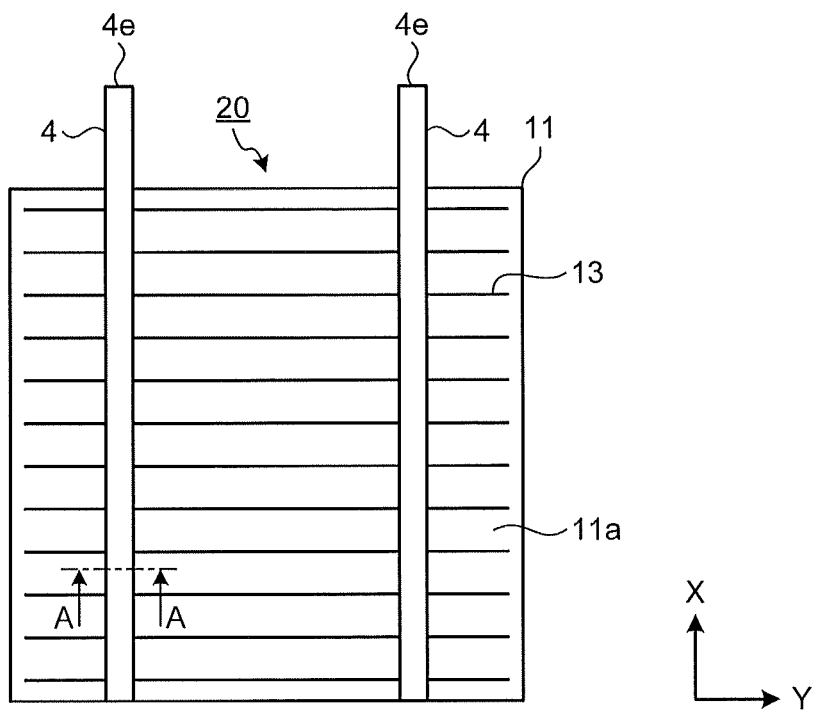
FIG. 5 is a top view of a state where a light-receiving-surface lead wire is joined to a light-receiving-surface bus electrode of a solar battery cell.
Figure 6:
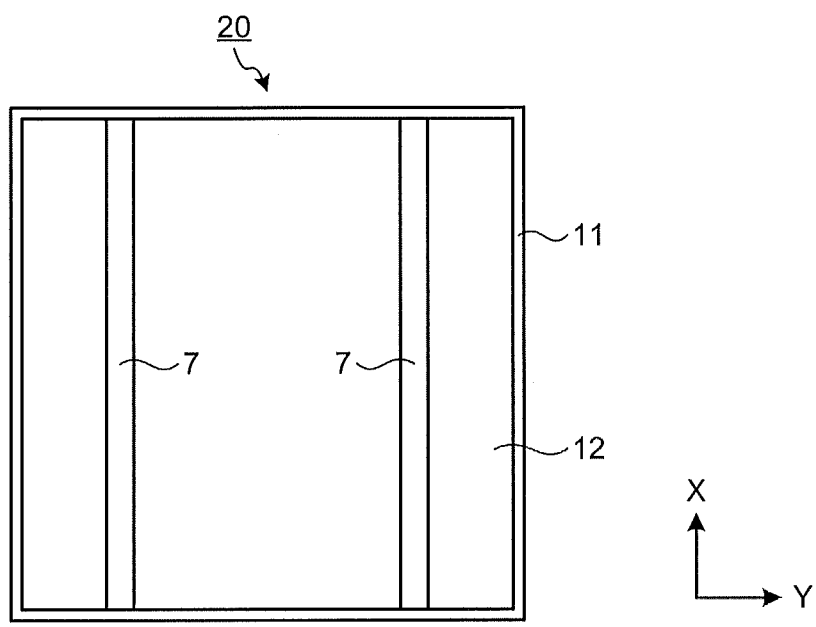
FIG. 6 is a rear view of a state where a rear-surface lead wire is joined to a rear-surface bus electrode of a solar battery cell.
Figure 7:
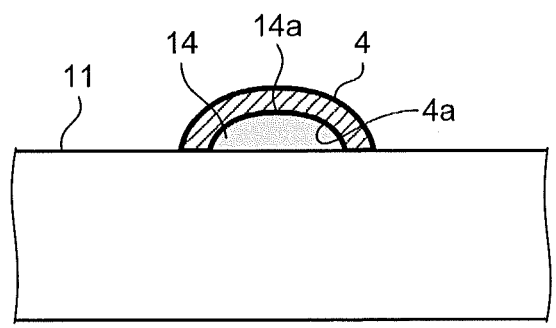
FIG. 7 is a sectional view on arrow along a line A-A in FIG. 5, and depicts a sectional shape of a light-receiving-surface lead wire and a light-receiving-surface bus electrode according to the present embodiment.
Figure 8:
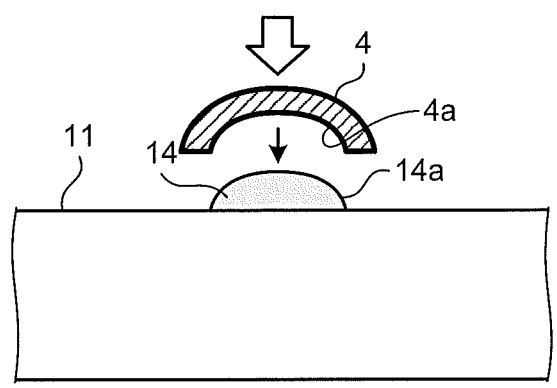
FIG. 8 is a sectional view of a manufacturing process according to the present embodiment, in which a light-receiving-surface lead wire is overlapped on a light-receiving-surface bus electrode.
Figure 9:
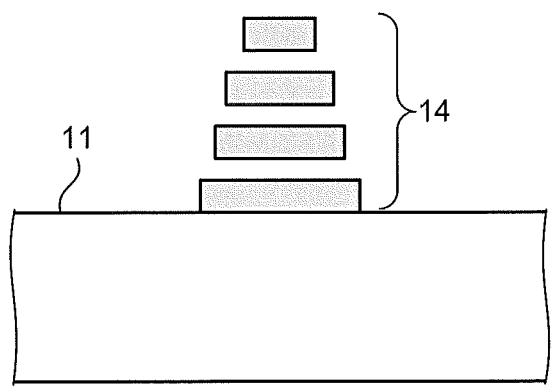
FIG. 9 is a sectional view schematically depicting a manufacturing process according to the present embodiment, in which a light-receiving-surface bus electrode is formed by performing screen printing for several times.
Figure 10:
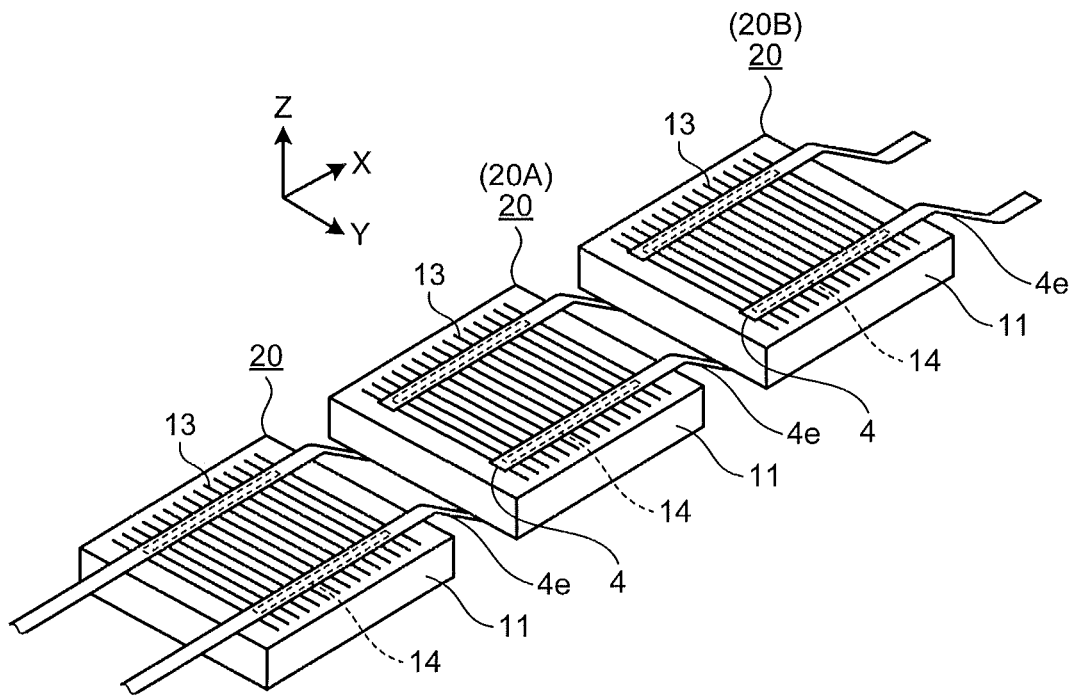
FIG. 10 is a perspective view of a state where a plurality of solar battery cells are serially connected as viewed from above.
Figure 11:
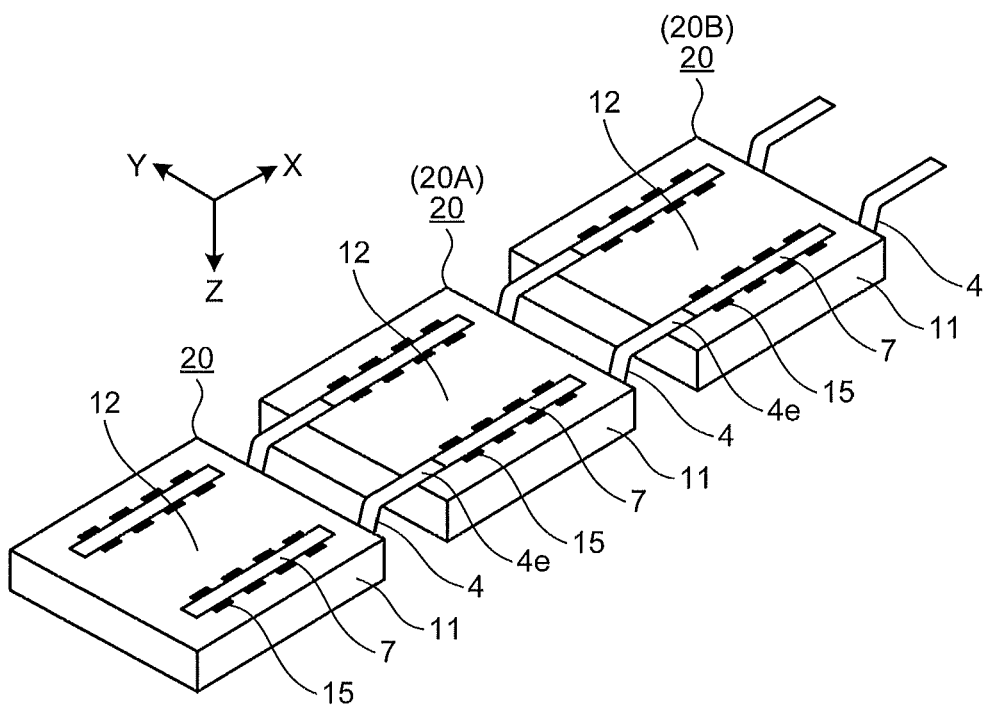
FIG. 11 is a perspective view of a state where a plurality of solar battery cells are serially connected as viewed from below.
Figure 12:
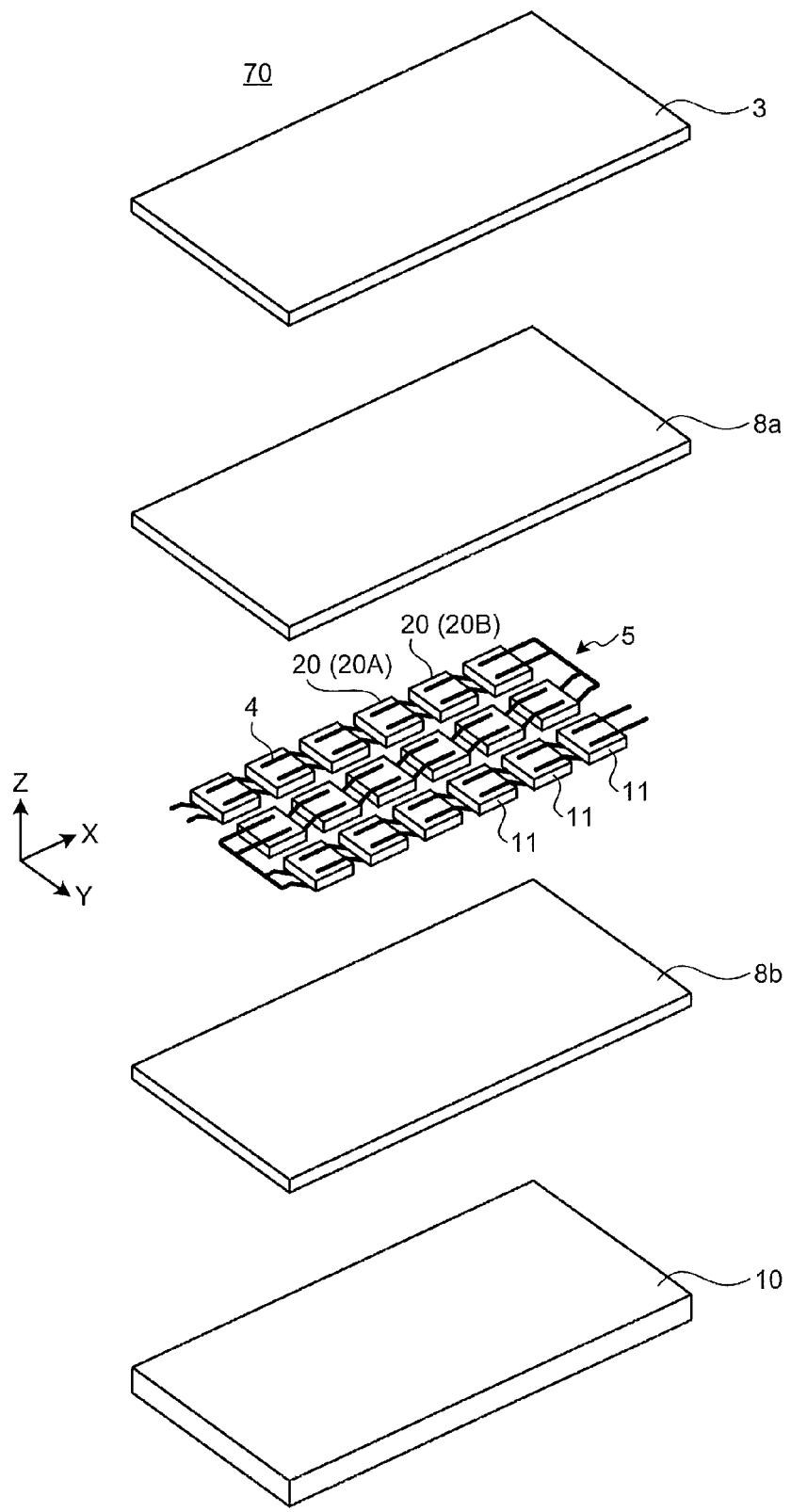
FIG. 12 is an exploded perspective view of a solar battery cell, and depicts a state of stacking respective components.
Figure 13:
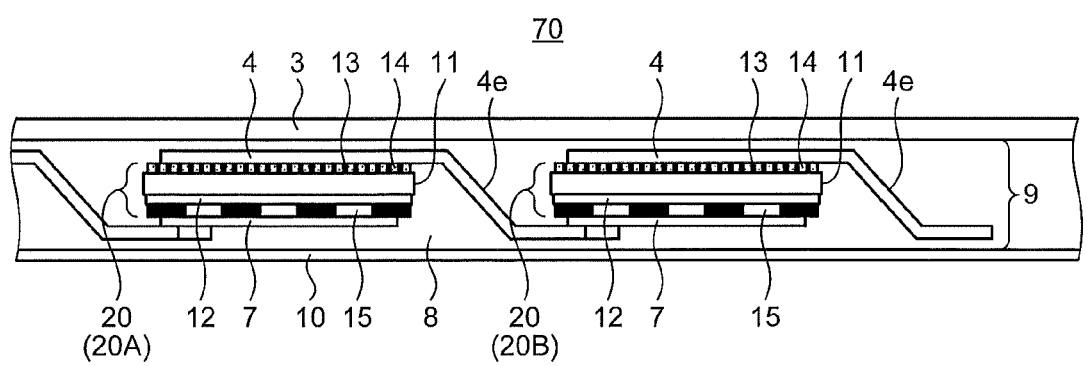
FIG. 13 is a sectional view of a connection state of two adjacent solar battery cells.

FIG. 1 is a perspective view of a solar battery module, depicting a state where a frame member is attached to a solar battery panel. FIG. 2 is a perspective view of a state where a solar battery array constituted by sequentially connecting a plurality of solar battery cells by a lead wire is sealed in a solar battery panel. FIG. 3 is a top view of a solar battery cell. FIG. 4 is a rear view of a solar battery cell. FIG. 5 is a top view of a state where a light-receiving-surface lead wire is joined to a light-receiving-surface bus electrode of a solar battery cell. FIG. 6 is a rear view of a state where a rear-surface lead wire is joined to a rear-surface bus electrode of a solar battery cell. FIG. 7 is a sectional view on arrow along a line A-A in FIG. 5, and depicts a sectional shape of a light-receiving-surface lead wire and a light-receiving-surface bus electrode according to the present embodiment. FIG. 8 is a sectional view of a manufacturing process according to the present embodiment, in which a light-receiving-surface lead wire is overlapped on a light-receiving-surface bus electrode. FIG. 9 is a sectional view schematically depicting a manufacturing process according to the present embodiment, in which a light-receiving-surface bus electrode is formed by performing screen printing for several times. FIG. 10 is a perspective view of a state where a plurality of solar battery cells are serially connected as viewed from above. FIG. 11 is a perspective view of a state where a plurality of solar battery cells are serially connected as viewed from below. FIG. 12 is an exploded perspective view of a solar battery cell, and depicts a state of stacking respective components. FIG. 13 is a sectional view of a connection state of two adjacent solar battery cells. The rear-surface bus electrode and the rear-surface lead wire overlapped thereon will be omitted in FIGS. 7 and 8.

A solar battery module 90 includes a plate-shaped solar battery panel 70 and a frame member 80 surrounding the entire circumference of the outer edge of the solar battery panel 70 (FIG. 1). A plurality of solar battery cells 20 arranged in a matrix are sealed in the solar battery panel 70 by a resin, and the light receiving surface is covered with a surface covering material 3 having translucency, and the rear surface is covered with a rear-surface covering material 10 (FIGS. 12 and 13).

The plurality of solar battery cells 20 are serially connected in an X-direction, which is a first direction, by a light-receiving-surface-side lead wire 4 and a rear-surface-side lead wire 7 (FIGS. 10 to 12). However, at the end of the solar battery panel 70, there are some solar battery cells 20 connected in a Y-direction. A belt-shaped copper foil generally referred to as "tab line" on which solder is provided (coated or applied) is used as the light-receiving-surface-side lead wire 4 and the rear-surface-side lead wire 7. A solar battery array 5 constituted by sequentially connecting the solar battery cells 20 by the lead wires 4 and 7 is sealed by a resin 8.

The frame member 80 is produced by extrusion molding of for example, aluminum, and covers the entire circumference of the outer edge of the solar battery panel 70 by a U-shaped portion formed in a U-shape in cross section (FIG. 1). The frame member 80 is fixed to the solar battery panel 70 via a butyl sealing material or a silicon adhesive, and has functions of reinforcing the solar battery panel 70 and fitting the solar battery panel 70 to constructions such as residential houses, buildings, or a pedestal provided on the ground or a structure.

The solar battery panel 70 has such a configuration that: the surface covering material 3 having translucency; a cell arrangement layer 9 on which the solar battery cells 20 and the light-receiving-surface-side lead wire 4 and the rear-surface-side lead wire 7 that serially connect these solar battery cells 20 are sealed by the resin 8 (8a and 8b) such as EVA (ethylene vinyl acetate); and the rear-surface covering material 10 having a good weather resistance formed of PET (polyethylene terephthalate) or PVF (polyvinyl fluoride); are stacked from a side of the light receiving surface (a surface side) (FIGS. 12 and 13).

The solar battery cell 20 is configured by using p-type silicon having a thickness of about 150 micrometers to 300 micrometers as a substrate. An n-type diffusion layer (an impurity diffusion layer (not shown)) is formed on the surface side of a p-type silicon substrate (a semiconductor substrate) 11, which becomes a p-type layer, by phosphorus diffusion, and an antireflection film 11a (FIG. 3) formed of a silicon nitride film for preventing reflection of incident light and improving the conversion efficiency is provided by surface treatment to become a light receiving surface of the solar battery cell 20. A p+ layer (not shown) containing highly-concentrated impurities is formed on the rear surface of the p-type silicon substrate (hereinafter, simply "substrate") 11, and a rear-surface collective electrode 12 made of aluminum is provided substantially over the whole surface of the rear surface in order to reflect the incident light and extract electricity.

A grid electrode 13 as a thin wire electrode made of silver and a light-receiving-surface bus electrode (a light-receiving-surface lead connection electrode) 14 having a predetermined width and made of silver, similarly to the grid electrode 13, are formed on the light receiving surface of the substrate 11 as a light-receiving-surface electrode that extracts electric energy converted from the incident light, which are electrically connected to the n-type diffusion layer on the bottom surface thereof, respectively. Two light-receiving-surface bus electrodes 14 are formed in parallel along a first direction, which is a connection direction of the solar battery cells 20. A plurality of grid electrodes 13 are formed thinly in a direction orthogonal to the light-receiving-surface bus electrodes 14. The grid electrode 13 is formed as thin as possible over the entire light receiving surface (surface) in order to extract electricity generated on the light receiving surface without any waste. By being illuminated with the solar light, the light receiving surface in FIGS. 3 and 5 becomes a negative (−) electrode, and the rear surface in FIGS. 4 and 6 becomes a positive (+) electrode. The light-receiving-surface-side lead wire 4 is joined to the light-receiving-surface bus electrode 14 to extract electric energy collected by the grid electrodes 13 further to outside (FIG. 5).

Meanwhile, the rear-surface collective electrode 12 made of aluminum is provided on the rear surface of the substrate 11 so as to cover substantially the whole surface of the rear surface. The rear-surface bus electrode (a rear-surface-lead connection electrode) 15 made of silver is formed at a position corresponding to the grid electrode 13 on the rear surface of the solar battery cell 20 (at a position overlapping on the grid electrode 13 in the thickness direction of the solar battery cell 20) extending in the first direction, which is the connection direction of the solar battery cell 20. The rear-surface-side lead wire 7 is connected to the rear-surface bus electrode 15 to further extract electric energy collected by the rear-surface collective electrode 12 to outside (FIG. 4).

The rear surface of the substrate 11 may be covered with a silver electrode over the whole surface. However, because it increases the cost, as described above, the silver rear-surface bus electrode 15 is provided only particularly at a portion connecting the rear-surface-side lead wire 7. The rear-surface bus electrode 15 may be provided while extending linearly in the first direction, other than the case of providing the lead connection electrodes in dots (like stepping stones) as in the present embodiment.

In the solar battery cell 20 configured in this manner, when the solar battery cell 20 is irradiated with the solar light from a side of the light receiving surface (an antireflection film side) of the solar battery cell 20 and the solar light reaches an inside pn junction surface (a junction surface of a p-type layer and a n-type diffusion layer), holes and electrons united on the pn junction surface are separated from each other. The separated electrons move toward the n-type diffusion layer. On the other hand, the separated holes move toward the p+ layer. Accordingly, a potential difference is generated so that the potential of the p+ layer becomes high, between the n-type diffusion layer and the p+ layer. As a result, a surface electrode connected to the n-type diffusion layer becomes a negative electrode, and a rear-surface electrode connected to the p+ layer becomes a positive electrode. When an external circuit (not shown) is connected, an electric current flows, and then operations as a solar battery are demonstrated. An output voltage of one solar battery cell is low. However, by serially connecting the solar battery cells 20 in plural in the solar battery module 90, the voltage is increased to a voltage that is easy to be used.

The serial connection of the solar battery cells 20 is performed by electrically connecting the light-receiving-surface bus electrode 14 of the first solar battery cell 20 (20A) and the rear-surface bus electrode 15 of the second solar battery cell 20 (20B) adjacent thereto by the belt-shaped lead wires 4 and 7 in the solar battery cells 20 arranged in the first direction (FIGS. 7 to 11).

In the present embodiment, the lead wires 4 and 7 are divided into the light-receiving-surface-side lead wire 4 and the rear-surface-side lead wire 7. The light-receiving-surface-side lead wire 4 of the both lead wires 4 and 7 extends to overlap on the light-receiving-surface bus electrode 14 and is joined by solder (mechanically and electrically connected) to the light-receiving-surface bus electrode 14. The light-receiving-surface-side lead wire 4 has an extending portion 4e elongated than the solar battery cell 20, and the extending portion 4e extends to one end side when the light-receiving-surface-side lead wire 4 is joined by solder onto the light-receiving-surface bus electrode 14 (FIG. 5).

The light-receiving-surface bus electrode 14 according to the present embodiment is in a flat semi-cylindrical shape having substantially a semicircular shape in cross section such that an outer periphery has a curved convex shape substantially in an arc-like shape toward the light-receiving-surface-side lead wire 4, to form a convex portion 14a extending in the length direction with respect to the light-receiving-surface-side lead wire 4 (FIG. 7). On the other hand, the light-receiving-surface-side lead wire 4 has a curved shape as a whole, rounded in the width direction, to form a concave portion 4a extending in the length direction on the surface facing the light-receiving-surface bus electrode 14. The convex portion 14a of the light-receiving-surface bus electrode 14 and the concave portion 4a of the light-receiving-surface-side lead wire 4 are overlapped and joined as shown in FIG. 8 in a manufacturing process. At this time, the both portions engage with each other without any gap therebetween. Therefore, in the present embodiment, the light-receiving-surface-side lead wire 4 is not misaligned in the width direction and does not drop off from the light-receiving-surface bus electrode 14.

At the time of forming the light-receiving-surface bus electrode 14 on the substrate 11 by screen printing, the convex portion 14a of the light-receiving-surface bus electrode 14 can be formed by printing an electrode paste by using a plurality of screens having different slit widths. Specifically, as shown in FIG. 9, a slit width of the first printing screen is made widest, and the slit widths of the second printing screen, the third printing screen, and so on are made narrower sequentially. When the change in the slit width is increased, the sectional shape of the light-receiving-surface bus electrode 14 becomes similar to a triangular shape with a large bottom and a shorter height. When the change in the slit width is decreased, the sectional shape of the light-receiving-surface bus electrode 14 becomes similar to a tall triangle. By changing the slit width, for example, the bus electrode having curved sides in cross section such as an ellipse can be obtained.

Meanwhile, the curved shape of the light-receiving-surface-side lead wire 4 is molded by deforming the lead wire by causing a rectangular copper wire to forcibly pass through a slit having a predetermined shape.

Figure 16:
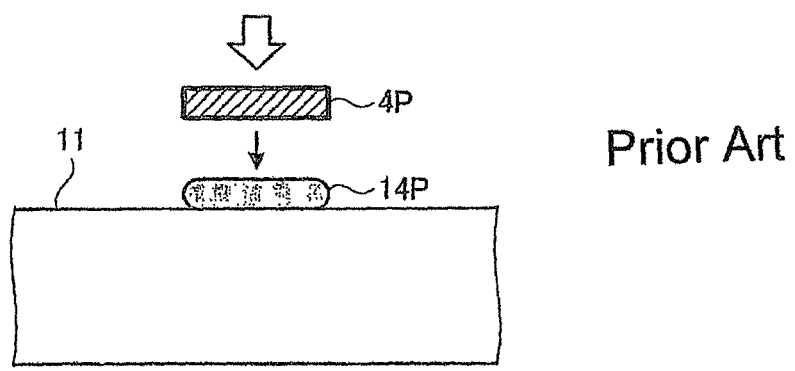
FIG. 16 is a diagram shown for a comparison, and is a sectional view of a manufacturing process in which a lead wire is overlapped on a light-receiving-surface bus electrode of a conventional solar battery cell.
Figure 17:
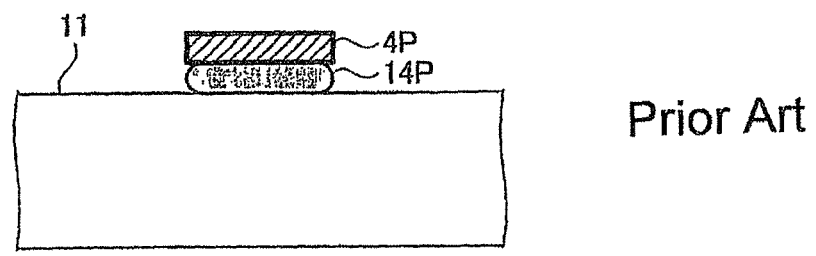
FIG. 17 is a diagram corresponding to the sectional view along a line A-A in FIG. 5, and depicts a sectional shape of the light-receiving-surface bus electrode and the lead wire of the conventional solar battery cell.
Figure 18:
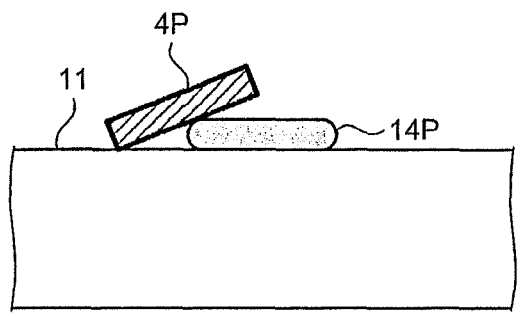
FIG. 18 is a sectional view of a state where a lead wire falls off from the light-receiving-surface bus electrode of the conventional solar battery cell.

FIG. 16 is a diagram shown for a comparison, and is a sectional view of a manufacturing process in which a lead wire 4P is overlapped on a light-receiving-surface bus electrode 14P of a conventional solar battery cell. FIG. 17 is a diagram corresponding to the sectional view along a line A-A in FIG. 5, and depicts a sectional shape of the light-receiving-surface bus electrode 14P and the lead wire 4P of the conventional solar battery cell. FIG. 18 is a sectional view of a state where a lead wire falls off from the light-receiving-surface bus electrode of the conventional solar battery cell. The rear-surface bus electrode 15 and the rear-surface-side lead wire 7 overlapping thereon will be omitted in FIGS. 16 to 18.

Conventionally, the light-receiving-surface bus electrode 14P formed on the surface of the solar battery cell 20 has been formed substantially in a square shape in cross section, with the both ends being in a semicircular shape. Meanwhile, the lead wire 4P has been used in the shape as it is without particularly deforming the rectangular copper wire having a square shape in cross section. That is, the configuration has been such that the light-receiving-surface bus electrode 14P is formed in a long convex shape having a square shape in cross section, and the light-receiving-surface-side lead wire 4P having a square shape in cross section is overlapped thereon and joined thereto (FIG. 17). Therefore, the light-receiving-surface-side lead wire 4P may fall off from the light-receiving-surface bus electrode 14P as shown in FIG. 18, upon application of a pressing force for joining the bus electrode to the lead wire as shown by a white arrow in FIG. 16. On the other hand, in the light-receiving-surface bus electrode 14 and the light-receiving-surface-side lead wire 4 according to the present embodiment, because the convex portion and the concave portion extending in the length direction and engaging with each other are provided on the surfaces facing each other, the light-receiving-surface-side lead wire 4 does not fall off.

Generally, as shown in FIG. 16, at the time of joining the light-receiving-surface-side lead wire 4P to the light-receiving-surface bus electrode 14P, a plurality of positions away from each other in the length direction of the light-receiving-surface-side lead wire 4P are pressurized at a point shown by the white arrow in FIG. 16 and are pressed against the substrate 11 (the light-receiving-surface bus electrode 14P). Therefore, a curving force does not act on the light-receiving-surface-side lead wire 4P. However, although not being used frequently, when a method of pressurizing the entire light-receiving-surface-side lead wire 4 over the surface is used, an edge or the like of the light-receiving-surface-side lead wire 4 may be slightly deformed to the side of the substrate 11. However, because the concave portion of the light-receiving-surface-side lead wire 4 formed in this manner does not have a shape fitted in the light-receiving-surface bus electrode 14 intentionally as in the present embodiment, it cannot be understood that the light-receiving-surface-side lead wire 4 engages with the light-receiving-surface bus electrode 14. Furthermore, the concave portion of the light-receiving-surface-side lead wire 4 formed in this manner cannot regulate misalignment of the light-receiving-surface-side lead wire 4.

In the light-receiving-surface-side lead wire 4 and the rear-surface-side lead wire 7 joined to the solar battery cell 20 in this manner, the rear-surface-side lead wire 7 extends on the rear-surface bus electrode 15, and is joined by solder (mechanically and electrically connected) to the rear-surface bus electrode 15. The light-receiving-surface-side lead wire 4 of the first solar battery cell 20 (20A) and the rear-surface-side lead wire 7 of the second solar battery cell 20 (20B) are joined by solder in order to serially connect the first solar battery cell 20 (20A) and the second solar battery cell 20 (20B). That is, the extending portion 4e of the light-receiving-surface-side lead wire 4 of the first solar battery cell 20 (20A) creeps into the rear surface side of the adjacent second solar battery cell 20 (20B), and is joined by solder to the rear-surface-side lead wire 7, which is joined by solder onto the rear-surface bus electrode 15. The connection of the adjacent two cells of the first solar battery cell 20 (20A) and the second solar battery cell 20 (20B) is only explained here. However, in practice, the same connection is repeated to serially connect a plurality of solar battery cells 20. According to the present embodiment, the lead wire is provided while being divided into the light-receiving-surface-side lead wire 4 and the rear-surface-side lead wire 7 as described above. However, one continuous lead wire may be also used for connection.

As described above, the rear-surface bus electrode 15 according to the present embodiment is provided in dots (like stepping stones). However, the rear-surface bus electrode 15 is frequently provided extending linearly. The rear-surface bus electrode 15 according to the present embodiment is substantially in a square shape or substantially in a square shape close to a semi-circular shape in cross section as in the conventional manner, and the rear-surface-side lead wire 7 formed by solder-coating the rectangular copper wire is joined thereto as in the conventional manner. Because the rear surface does not include the light receiving surface, even if the lead wire is misaligned from the rear-surface-side lead wire 7, there is no possibility of narrowing the light receiving surface. However, when the electrical resistance is taken into consideration, the rear-surface bus electrode 15 and the rear-surface-side lead wire 7 may be formed with the concave portion and the convex portion and engaged with each other as in the light-receiving-surface bus electrode 14 and the light-receiving-surface-side lead wire 4 according to the present embodiment.

Figure 14:
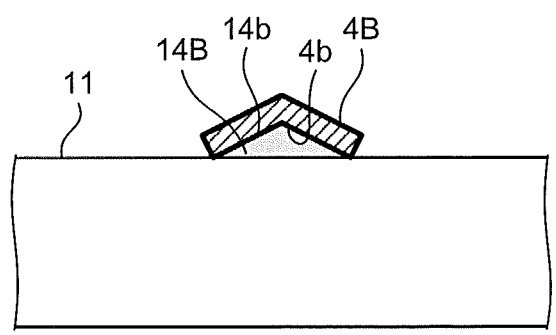
FIG. 14 depicts a sectional shape of a lead wire and a light-receiving-surface bus electrode of a solar battery cell in another example of the present embodiment, corresponding to the sectional view along the line A-A in FIG. 5.

The light-receiving-surface bus electrode 14 according to the present embodiment is formed with the convex portion having a curved shape in cross section. On the other hand, the opposing surface of the light-receiving-surface-side lead wire 4 has the concave portion that engages with the curved surface of the light-receiving-surface bus electrode 14 without any gap therebetween. However, the shapes of the convex portion and the concave portion are not limited thereto. FIG. 14 is another example of the present embodiment and depicts a sectional shape of a light-receiving-surface-side lead wire 4B and a light-receiving-surface bus electrode 14B of a solar battery cell, corresponding to the sectional view along the line A-A in FIG. 5.

According to the solar battery cell in FIG. 14, the light-receiving-surface bus electrode 14B has substantially a triangular shape in cross section so as to form a convex shape toward the light-receiving-surface-side lead wire 4B, thereby forming a convex portion 14b extending in the length direction. On the other hand, the light-receiving-surface-side lead wire 4B has a shape folded back in a dogleg shape in cross section at the center line, to form a concave portion 4b extending in the length direction. The convex portion 14b of the light-receiving-surface bus electrode 14B and the concave portion 4b of the light-receiving-surface-side lead wire 4B engage with each other without any gap therebetween, at the time of being overlapped and joined on each other as shown in FIG. 14. Therefore, even in such a configuration, the effect that the light-receiving-surface-side lead wire 4B does not fall off from the light-receiving-surface bus electrode 14B can be achieved. Furthermore, because the surface is a flat plane, the design thereof is simple. In the light-receiving-surface-side lead wire 4B, manufacturing thereof is simple because it is folded only at the center.

Figure 15:
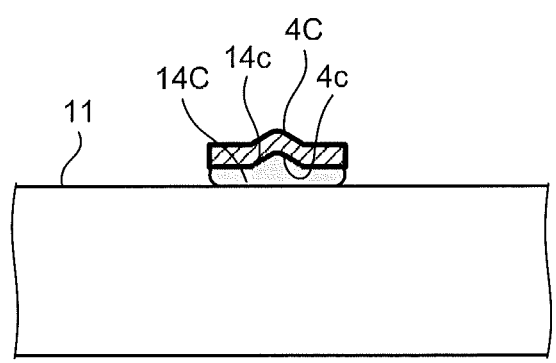
FIG. 15 depicts a sectional shape of a lead wire and a light-receiving-surface bus electrode of a solar battery cell in still another example of the present embodiment, corresponding to the sectional view along the line A-A in FIG. 5.

In the light-receiving-surface bus electrode 14 in FIG. 7 and the light-receiving-surface bus electrode 14B in FIG. 14, the surface facing the light-receiving-surface lead wire has a convex portion formed over the whole surface. However, the convex portion does not need to be formed over the whole surface. FIG. 15 depicts a sectional shape of a light-receiving-surface-side lead wire 4C and a light-receiving-surface bus electrode 14C of the solar battery cell 20 in still another example of the present embodiment. In the example of FIG. 15, a convex portion 14c formed in the light-receiving-surface bus electrode 14C is formed not over the whole surface in the width direction, but is formed only in the central part. Correspondingly thereto, a concave portion 4c formed in the light-receiving-surface side lead wire 4C is formed only in the central part. The convex portion 14c and the concave portion 4c shown in FIG. 15 are formed extending in the length direction of the light-receiving-surface-side lead wire 4C.

The concave portion 4c formed on the light-receiving-surface-side lead wire 4C does not need to be always formed continuously along the length direction. However, when the manufacturing process in which the lead wire is forcibly caused to pass through the slit is taken into consideration, manufacturing becomes easier when the light-receiving-surface-side lead wire 4C has the same sectional shape in the length direction. Furthermore, the convex portion 14c formed on the light-receiving-surface bus electrode 14C also does not need to be always formed continuously along the length direction. However, when the contact area with the light-receiving-surface-side lead wire 4C is taken into consideration, by having the same sectional shape in the length direction, the contact area can be increased, and the resistance can be reduced.

In the light-receiving-surface bus electrodes 14, 14B, and 14C and the light-receiving-surface lead wires 4, 4B, and 4C according to the present embodiment, the convex portions 14a, 14b, and 14c are provided in the light-receiving-surface bus electrodes 14, 14B, and 14C, and the concave portions 4a, 4b, and 4c are provided in the light-receiving-surface lead wires 4, 4B, and 4C, respectively, in order to regulate misalignment. However, on the contrary, the concave portion may be provided in the light-receiving-surface bus electrodes 14, 14B, and 14C, and the convex portion can be provided in the light-receiving-surface lead wires 4, 4B, and 4C.

The solar battery cell 20 (the silicon substrate 11) according to the present embodiment is substantially plate-shaped; however, the solar battery cell 20 is not limited to plate-shaped, and for example, can be in a flexible sheet form or a cubic form, so long as the solar battery cell 20 includes the light-receiving-surface bus electrode 14 formed on a light receiving surface. Furthermore, the solar battery module 90 according to the present embodiment has the solar battery array 5 in which the solar battery cells 20 are connected by the lead wires 4 and 7. However, the solar battery module may have only one solar battery cell 20. Further, the grid electrodes 13 according to the present embodiment are formed parallel to each other on the light receiving surface. However, the grid electrodes 13 may not be formed parallel to each other, so long as the solar battery cell includes a plurality of grid electrodes formed on the light receiving surface.

INDUSTRIAL APPLICABILITY

As described above, the joining method of a lead wire of a solar battery cell according to the present invention is useful in application to a joining method of a lead wire in which a lead wire provided with solder or a joining resin is overlapped on a light-receiving-surface bus electrode of the solar battery cell, heated, and pressurized to join the lead wire to the light-receiving-surface bus electrode, and the method according to the present invention is particularly suitable for application to a joining method of a lead wire of a high-performance solar battery cell.

REFERENCE SIGNS LIST 3 surface covering material
4, 4B, 4C, 4P light-receiving-surface-side lead wire (lead wire)
4a, 4b, 4c concave portion
4e extending portion
5 solar battery array
7 rear-surface-side lead wire (lead wire)
8, 8a, 8b resin
9 cell arrangement layer 10 rear-surface covering material
11 p-type silicon substrate (semiconductor substrate)
12 rear-surface collective electrode
13 grid electrode
14, 14B, 14C light-receiving-surface bus electrode (light-receiving-surface lead wire connection electrode)
14a, 14b, 14c convex portion
15 rear-surface bus electrode (rear-surface-lead wire connection electrode)
20 solar battery cell
70 solar battery panel
80 frame member
90 solar battery module

The invention claimed is:

1. A solar battery cell comprising:
a light-receiving-surface bus electrode;
a light receiving surface of a semiconductor substrate; and
a lead wire configured to extract electricity, wherein the light-receiving-surface bus electrode extends in a predetermined direction on the light receiving surface of the semiconductor substrate, wherein
the lead wire is overlapped on and joined to the light-receiving-surface bus electrode, and
the light-receiving-surface bus electrode and the lead wire are respectively provided with mutually engaging convex portions and concave portions on surfaces thereof facing each other so that the surface of the light-receiving-surface bus electrode and a light-receiving surface of the lead wire have the same shape so as to regulate misalignment in a width direction between the light-receiving-surface bus electrode and the lead wire.

2. The solar battery cell according to claim 1, wherein the convex portions and the concave portions are formed to extend in a length direction of the light-receiving-surface bus electrode and the lead wire.

3. The solar battery cell according to claim 1, wherein the convex portion is substantially in a semicircular shape in cross section, and the concave portion is in a depressed circular arc shape in cross section with an opposing surface thereof engaging with the convex portion.

4. The solar battery cell according to claim 1, wherein the convex portion is substantially in a triangular shape in cross section, and the concave portion is in a depressed triangular shape in cross section, with an opposing surface that faces the bus electrode engaging with the convex portion.

5. The solar battery cell according to claim 1, wherein the lead wire contacts the light receiving surface of the semiconductor substrate.

6. The solar battery cell according to claim 1, wherein the light-receiving-surface bus electrode and the lead wire are connected with a joining material.

7. A solar battery cell comprising:
a light receiving surface of a semiconductor substrate;
a light-receiving-surface bus electrode extending in a predetermined direction;
a rear-surface bus electrode provided on a rear surface of the semiconductor substrate; and
a lead wire for extracting electricity, wherein
the lead wire is joined to the light-receiving-surface bus electrode and the rear-surface bus electrode so that the lead wire overlaps the light-receiving-surface bus electrode and the rear-surface bus electrode, and
the light-receiving-surface bus electrode and the lead wire are respectively provided with mutually engaging convex portions and concave portions on surfaces thereof facing each other so that the surface of the light-receiving-surface bus electrode and a light-receiving surface of the lead wire have the same shape so as to regulate misalignment in a width direction between the light-receiving-surface bus electrode and the lead wire.

8. The solar battery cell according to claim 7, wherein the convex portions and the concave portions are formed to extend in a length direction of the light-receiving-surface bus electrode and the lead wire.

9. The solar battery cell according to claim 7, wherein the convex portion is substantially in a semicircular shape in cross section, and the concave portion is in a depressed circular arc shape in cross section with an opposing surface thereof engaging with the convex portion.

10. The solar battery cell according to claim 7, wherein the convex portion is substantially in a triangular shape in cross section, and the concave portion is in a depressed triangular shape in cross section, with an opposing surface that faces the bus electrode engaging with the convex portion.

11. The solar battery cell according to claim 7, wherein the lead wire contacts the light receiving surface of the semiconductor substrate.

12. The solar battery cell according to claim 7, wherein the light-receiving-surface bus electrode and the lead wire are connected with a joining material.

13. A solar battery module comprising:
a plurality of solar battery cells having a light-receiving-surface bus electrode extending in a predetermined direction on a light receiving surface of a semiconductor substrate and a rear-surface bus electrode on a rear surface of the semiconductor substrate; and
a lead wire that electrically connects the light-receiving-surface bus electrode of a first solar battery cell and the rear-surface bus electrode of a second solar battery cell adjacent thereto, wherein
the light-receiving-surface bus electrode and the lead wire are formed to extend in a length direction on surfaces facing each other and respectively provided with mutually engaging convex portions and concave portions, wherein the surface of the light-receiving-surface bus electrode and a light-receiving surface of the lead wire have the same shape so as to regulate misalignment in a width direction between the light-receiving-surface bus electrode and the lead wire.

14. The solar battery module according to claim 13, wherein the lead wire contacts the light receiving surface of the semiconductor substrate.

15. The solar battery module according to claim 13, wherein the light-receiving-surface bus electrode and the lead wire are connected with a joining material.

16. A joining method of a lead wire of a solar battery cell in which a lead wire for extracting electricity is joined to a light-receiving-surface bus electrode and a rear-surface bus electrode of a solar battery cell so that the lead wire overlaps the light-receiving-surface bus electrode and the rear-surface bus electrode, the solar battery cell having the light-receiving-surface bus electrode extending in a predetermined direction on a light receiving surface of a semiconductor substrate and the rear-surface bus electrode on a rear surface of the semiconductor substrate, the joining method comprising:
forming convex portions and concave portions extending in a length direction on surfaces facing each other of the light-receiving-surface bus electrode and the lead wire so that the surface of the light-receiving-surface bus electrode and a light-receiving surface of the lead wire have the same shape; and
engaging the convex portions and the concave portions with each other, overlapping the lead wire on the light-receiving-surface bus electrode and joining the lightreceiving-surface bus electrode and the lead wire to each other, while regulating misalignment in a width direction between the light-receiving-surface bus electrode and the lead wire.

17. The joining method of a lead wire of a solar battery cell according to claim 16, wherein
the convex portion is formed on the light-receiving-surface bus electrode at a time of forming the light-receiving-surface bus electrode on the semiconductor substrate by screen printing.

18. The joining method of a lead wire of a solar battery cell according to claim 17, wherein
the convex portion is produced by overlapping and forming an electrode paste having a narrow width on an electrode paste having a wide width, using a plurality of screens having different widths gradually from the wide screen toward the narrow screen.

19. The joining method of a lead wire of a solar battery cell according to claim 16, wherein
the concave portion is formed in the lead wire by causing the lead wire to pass through a slit having a predetermined shape thereby deforming the lead wire.

20. The joining method of a lead wire of a solar battery cell according to claim 16, wherein the lead wire contacts the light receiving surface of the semiconductor substrate.

21. The joining method of a lead wire of a solar battery cell according to claim 16, wherein the light-receiving-surface bus electrode and the lead wire are engaged with a joining material.

* * * * *